(12) United States Patent
Yoo et al.

(10) Patent No.: US 10,680,144 B2
(45) Date of Patent: Jun. 9, 2020

(54) QUANTUM DOT GLASS CELL AND LIGHT-EMITTING DEVICE PACKAGE INCLUDING THE SAME

(71) Applicant: Samsung Electronics Co., Ltd., Suwon-si, Gyeonggi-do (KR)

(72) Inventors: Chul-hee Yoo, Yongin-si (KR); Ho-young Song, Suwon-si (KR); Seung-hwan Choi, Suwon-si (KR)

(73) Assignee: Samsung Electronics Co., Ltd., Gyeonggi-di (KR)

( * ) Notice: Subject to any disclaimer, the term of this patent is extended or adjusted under 35 U.S.C. 154(b) by 146 days.

(21) Appl. No.: 15/819,025

(22) Filed: Nov. 21, 2017

(65) Prior Publication Data

US 2018/0351052 A1   Dec. 6, 2018

(30) Foreign Application Priority Data

Jun. 5, 2017 (KR) .................. 10-2017-0069770

(51) Int. Cl.
*H01L 33/50* (2010.01)
*C03B 23/20* (2006.01)
(Continued)

(52) U.S. Cl.
CPC ............ *H01L 33/505* (2013.01); *C03B 23/20* (2013.01); *C03C 27/06* (2013.01); *H01L 33/486* (2013.01); *H01L 33/501* (2013.01); *H01L 33/502* (2013.01); *H01L 33/507* (2013.01); *H01L 33/54* (2013.01); *H01L 33/58* (2013.01); *B82Y 20/00* (2013.01); *F21K 9/232* (2016.08); *F21K 9/233* (2016.08); *F21K 9/235* (2016.08); *F21K 9/237* (2016.08); *F21K 9/238* (2016.08); *F21V 29/76* (2015.01); *F21Y 2115/10* (2016.08); *G02B 6/009* (2013.01); *G02B 6/0055* (2013.01); *G02B 6/0073* (2013.01); *G02B 6/0088* (2013.01);
(Continued)

(58) Field of Classification Search
None
See application file for complete search history.

(56) References Cited

U.S. PATENT DOCUMENTS 6,372,608 B1   4/2002   Shimoda et al.
6,645,830 B2   11/2003   Shimoda et al.
(Continued)

FOREIGN PATENT DOCUMENTS

KR   20110136676 A   12/2011
KR   20120050286 A   5/2012
(Continued)

*Primary Examiner* — Michelle Mandala
*Assistant Examiner* — Jordan M Klein
(74) *Attorney, Agent, or Firm* — Harness, Dickey & Pierce, P.L.C.

(57) ABSTRACT

Provided are a quantum dot glass cell and a light-emitting device package including the quantum dot glass cell. The quantum dot glass cell may include a quantum dot powder in which quantum dots, inorganic homogenizing particles, and a binder are mixed, a dispersion matrix in which the quantum dot powder is dispersed, and a glass sealing structure surrounding the dispersion matrix. The quantum dot glass cell and the light-emitting device package including the quantum dot glass cell may have improved light emission characteristics and improved reliability.

20 Claims, 17 Drawing Sheets

(51) Int. Cl.
*H01L 33/54* (2010.01)
*H01L 33/58* (2010.01)
*H01L 33/48* (2010.01)
*C03C 27/06* (2006.01)
*F21K 9/233* (2016.01)
*B82Y 20/00* (2011.01)
*H01L 33/60* (2010.01)
*H01L 33/64* (2010.01)
*H01L 33/62* (2010.01)
*F21K 9/235* (2016.01)
*F21K 9/232* (2016.01)
*F21K 9/237* (2016.01)
*F21V 29/76* (2015.01)
*F21K 9/238* (2016.01)
*F21Y 115/10* (2016.01)
*F21V 8/00* (2006.01)
*G02F 1/1335* (2006.01)
*G02F 1/1343* (2006.01)
*G02F 1/1368* (2006.01)
*G02F 1/13357* (2006.01)

(52) U.S. Cl.
CPC .......... *G02B 6/0091* (2013.01); *G02F 1/1368* (2013.01); *G02F 1/133514* (2013.01); *G02F 1/134336* (2013.01); *G02F 2001/133614* (2013.01); *G02F 2201/121* (2013.01); *G02F 2201/123* (2013.01); *G02F 2201/50* (2013.01); *H01L 33/60* (2013.01); *H01L 33/62* (2013.01); *H01L 33/641* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,819,539 B2 * | 10/2010 | Kim | H01L 33/507 313/110 |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,142,736 B2 * | 9/2015 | Qiu | H01L 27/15 |
| 2005/0057144 A1 * | 3/2005 | Morita | H01L 33/56 313/501 |
| 2008/0149166 A1 * | 6/2008 | Beeson | H01L 31/02322 136/248 |
| 2008/0164462 A1 * | 7/2008 | Lee | C03C 8/02 257/40 |
| 2011/0303940 A1 * | 12/2011 | Lee | H01L 33/54 257/98 |
| 2012/0200219 A1 * | 8/2012 | Song | B82Y 20/00 313/498 |
| 2014/0021503 A1 * | 1/2014 | Yoshida | H01L 33/507 257/98 |
| 2014/0022779 A1 * | 1/2014 | Su | F21V 9/30 362/231 |
| 2015/0083970 A1 * | 3/2015 | Koh | C09K 11/02 252/301.35 |
| 2015/0204515 A1 * | 7/2015 | Xu | B82Y 20/00 362/84 |
| 2015/0285985 A1 * | 10/2015 | Shin | G02B 6/0073 362/97.1 |
| 2016/0104825 A1 | 4/2016 | Sato | |
| 2016/0268486 A1 | 9/2016 | Harris | |
| 2016/0315217 A1 | 10/2016 | Yang et al. | |
| 2017/0096538 A1 * | 4/2017 | Sasaki | C09D 7/40 |

FOREIGN PATENT DOCUMENTS

| | | |
|---|---|---|
| KR | 20130055058 A | 5/2013 |
| KR | 101326938 B1 | 11/2013 |
| KR | 20130136259 A | 12/2013 |
| KR | 20140076221 A | 6/2014 |
| KR | 101568707 B1 | 11/2015 |
| KR | 20160026159 A | 3/2016 |
| KR | 20160130540 A | 11/2016 |

* cited by examiner

COMPARATIVE EXAMPLE

QUANTUM DOT GLASS CELL AND LIGHT-EMITTING DEVICE PACKAGE INCLUDING THE SAME

CROSS-REFERENCE TO RELATED APPLICATION

This application claims the benefit of Korean Patent Application No. 10-2017-0069770, filed on Jun. 5, 2017, in the Korean Intellectual Property Office, the disclosure of which is incorporated herein in its entirety by reference.

BACKGROUND

Inventive concepts relate to a quantum dot glass cell and a light-emitting device package including the quantum dot glass cell, and more particularly, to a quantum dot glass cell having improved light emission characteristics and improved reliability, and a light-emitting device package including the quantum dot glass cell.

Quantum dots are semiconductor nanoparticles having a diameter of about 10 nm or less, exhibiting a quantum confinement effect. The quantum dots may function as wavelength conversion material because the quantum dots may absorb light and output light having a wavelength different from that of incident light.

Since the quantum dots have a characteristic in which the wavelength of emitted light varies depending on a particle size, even though materials are the same, the quantum dots have advantages of improved wavelength control. In addition, the quantum dots have a narrow half-width of emitted light. However, when the quantum dots are not properly dispersed or are exposed to heat, oxygen, and/or moisture, there is a problem in that light emission characteristics may deteriorate. Thus, improving the light emission characteristics and reliability of a quantum dot glass cell including the quantum dots and a light-emitting device package including the quantum dot glass cell may be desirable.

SUMMARY

Inventive concepts provide a quantum dot glass cell having improved light emission characteristics and improved reliability, and a light-emitting device package including the quantum dot glass cell.

According to an aspect of inventive concepts, there is provided a quantum dot glass cell including a quantum dot powder including quantum dots, inorganic homogenizing particles, and a binder, wherein the quantum dots, the inorganic homogenizing particles, and the binder are mixed together, a dispersion matrix in which the quantum dot powder is dispersed, and a glass sealing structure surrounding the dispersion matrix.

According to an aspect of inventive concepts, there is provided a quantum dot glass cell including a glass container including an opening, a dispersion matrix in the opening, a quantum dot powder dispersed in the dispersion matrix, and a glass cover on the glass container and the dispersion matrix. The quantum dot powder including quantum dots, inorganic homogenizing particles, and a binder.

According to an aspect of inventive concepts, there is provided a light-emitting device package including a substrate, a housing on the substrate, the housing comprising a cavity, a light-emitting device on the substrate, the light-emitting device being in the cavity of the housing, a light-emitting device encapsulation portion covering the light-emitting device, and a quantum dot glass cell on the light-emitting device encapsulation portion. The quantum dot glass cell includes a quantum dot powder including quantum dots, inorganic homogenizing particles, and a binder, wherein the quantum dots, the inorganic homogenizing particles, and the binder are mixed together. The quantum dot glass cell includes a dispersion matrix in which the quantum dot powder is dispersed, and a glass sealing structure surrounding the dispersion matrix.

BRIEF DESCRIPTION OF THE DRAWINGS

Embodiments of inventive concepts will be more clearly understood from the following detailed description taken in conjunction with the accompanying drawings in which.

DETAILED DESCRIPTION OF THE EMBODIMENTS

Figure 1:
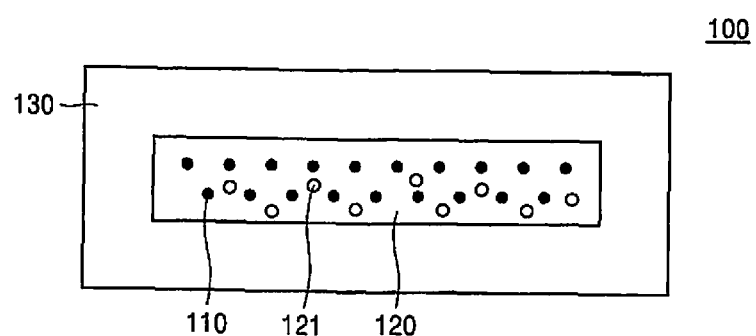
FIG. 1 is a cross-sectional view of a quantum dot glass cell according to an embodiment.

FIG. 1 is a cross-sectional view of a quantum dot glass cell 100 according to an example embodiment.

Referring to FIG. 1, the quantum dot glass cell 100 according to the embodiment may include a quantum dot powder 110, a dispersion matrix 120 in which the quantum dot powder 110 is dispersed, and a glass sealing structure 130 surrounding the dispersion matrix 120.

A detailed description of the quantum dot powder 110 will be given later with reference to FIGS. 2A and 2B, and a detailed description of the glass sealing structure 130 will be given later with reference to FIGS. 3A and 3B and FIGS. 4A and 4B. First, the dispersion matrix is described.

The dispersion matrix 120 may function to disperse the quantum dot powder 110. The dispersion matrix 120 may include a material including at least one of epoxy, polymethyl methacrylate (PMMA), polyethylene, polystyrene, and polyurethane resin. In some embodiments, the dispersion matrix 120 may include a silicone resin that is highly resistant to heat, moisture, and/or light.

According to an example embodiment, the dispersion matrix 120 may include a light-diffusing agent 121. The light-diffusing agent 121 may uniformly disperse light incident on the quantum dot glass cell 100 into the entire quantum dot glass cell 100, thereby increasing light conversion efficiency and enabling uniform wavelength conversion. In addition, the light-diffusing agent 121 may improve the luminance of a light-emitting device package in which the quantum dot glass cell 100 is employed. The light-diffusing agent 121 may include at least one of, for example, silica ($SiO_2$), titania ($TiO_2$), and alumina ($Al_2O_3$). In some example embodiments, the light-diffusing agent 121 may include an alumina ($Al_2O_3$) powder. When the light-diffusing agent 121 includes alumina, the dispersion of the quantum dot powder 110 may be more uniform.

Figure 2A:
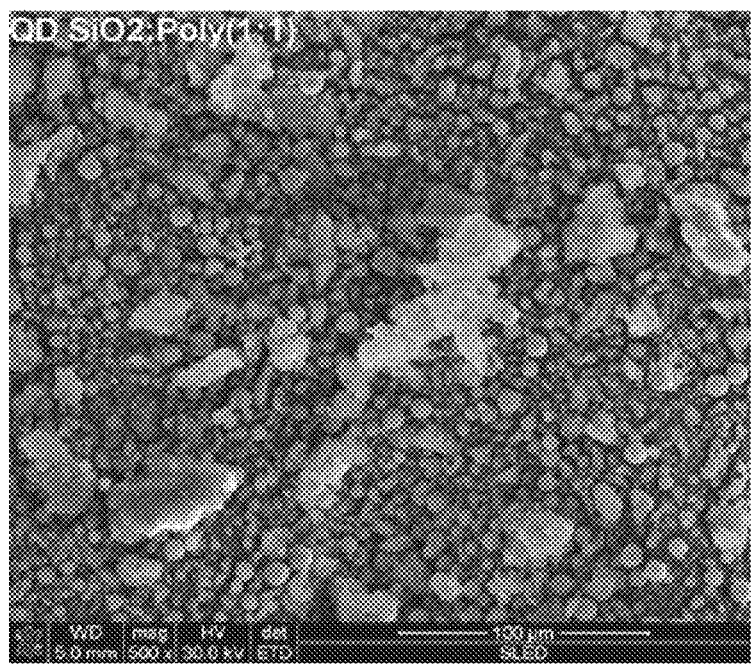
FIG. 2A is an electron microscope image of a quantum dot powder of a quantum dot glass cell according to an embodiment.

FIG. 2A is an electron microscope image of a quantum dot powder of a quantum dot glass cell according to an example embodiment. FIG. 2C schematically illustrates a quantum dot powder according to an embodiment. The quantum dot powder 110 according to an embodiment may have a structure in which quantum dots 111, inorganic homogenizing particles 112 and a binder 113 are mixed.

The quantum dot may absorb incident light and emit light having a wavelength different from that of the incident light. For example, the quantum dot may convert blue light into green light or red light. In another embodiment, ultraviolet light may be changed to blue light, green light or red light.

The quantum dot may include any one selected from a silicon-based nanocrystal, a group II-VI-based compound semiconductor nanocrystal, a group III-V-based compound semiconductor nanocrystal, a group IV-VI-based compound semiconductor nanocrystal, and a mixture thereof.

The group II-VI-based compound semiconductor nanocrystal may be or may include any one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgSe, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe.

The group III-V-based compound semiconductor nanocrystal may be or may include any one selected from the group consisting of GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaInPAs, GaInNP, GaInNAs, GaInPAs, InAlNP, InAlNAs, and InAlPAs.

The group IV-VI-based compound semiconductor nanocrystal may be or may include SbTe.

The quantum dot may have an alloy, gradient, or core-shell structure. The alloy quantum dot may have a structure in which different types of compound semiconductor materials are uniformly mixed. The gradient quantum dot may have a composition gradually changing from the center of the quantum dot to the outer periphery thereof. The quantum dot having the core-shell structure may include a core nanocrystal and a shell nanocrystal surrounding the core nanocrystal. For example, the diameter of the core nanocrystal may be from about 1 nm to about 30 nm, or from about 3 nm to about 10 nm, and the thickness of the shell nanocrystal may be from about 0.1 nm to about 20 nm, or from about 0.5 nm to about 2 nm. In addition, the shell nanocrystal may include an organic ligand combined therewith to stabilize the core and the shell.

A quantum dot having the alloy structure, the gradient structure or the core/shell structure may be or may include any one selected from the group consisting of CdSe/ZnS, CdSe/ZnSe/Zn, CdSe/CdS/ZnCdS/ZnS, InP/ZnS, InP/Ga/ZnS, InP/ZnSe/ZnS, PbSe/PbS, CdSe/CdS, CdSe/CdS/ZnS, CdTe/CdS, CdTe/ZnS, $CuInS_2$/ZnS, and $Cu_2SnS_3$/ZnS.

The inorganic homogenizing particle may function to homogenize and miniaturize the size of the quantum dot powder. According to an example embodiment, the inorganic homogenizing particle may include at least one of silica ($SiO_2$), titania ($TiO_2$), and/or alumina ($Al_2O_3$). The silica, titania, and alumina may also function as a light-diffusing agent, so that more uniform and efficient wavelength conversion of the quantum dot glass cell may be made possible or improved.

The binder may bind quantum dots and inorganic homogenizing particles to form a powder. According to an embodiment, the binder may include at least one of an ethylene-methacrylic acid (EMAA) copolymer resin and an ethylene-acrylic acid (EAA) copolymer resin. Specifically, the binder may be NUCREL® resin sold by DuPont.

Referring to FIGS. 2A and 2C, the quantum dot powder 110 according to an embodiment has a structure in which quantum dots 111, inorganic homogenizing particles 112 including silica ($SiO_2$), and a binder 113 are mixed. The diameter of the quantum dot powder 110 according to an embodiment may be from about 1 μm to about 50 μm, and may typically be from about 5 μm to about 15 μm.

Figure 2B:
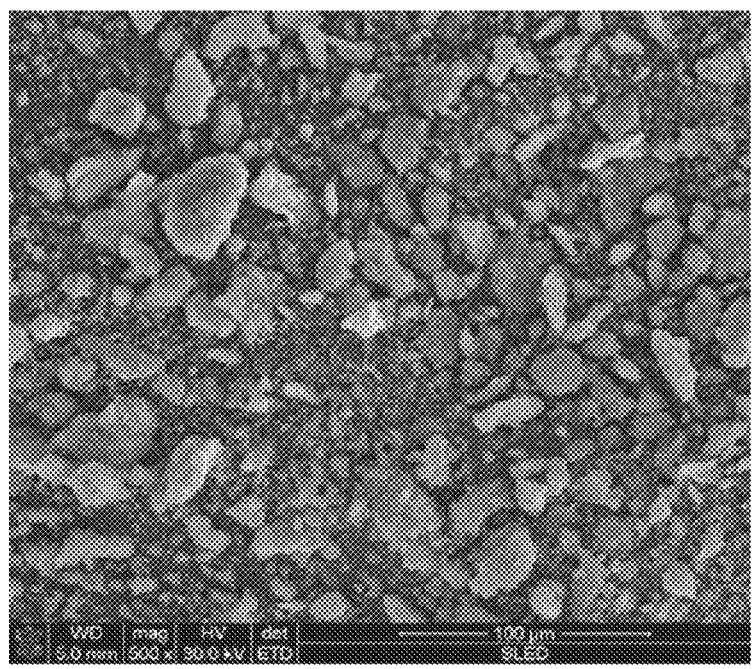
FIG. 2B is an electron microscope image of a quantum dot powder that does not contain inorganic homogenizing particles.
Figure 2C:
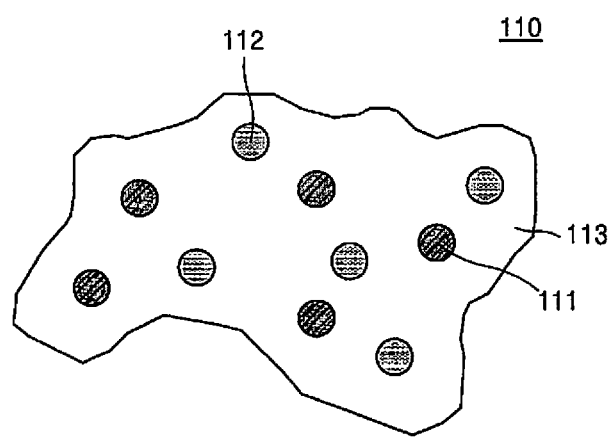
FIG. 2C is a schematic illustrating a quantum dot powder according to an embodiments.

FIG. 2B is an electron microscope image of a quantum dot powder that does not contain inorganic homogenizing particles.

Referring to FIG. 2B, the quantum dot powder of FIG. 2B differs from the quantum dot powder according to an embodiment in that the quantum dot powder of FIG. 2B does not contain inorganic homogenizing particles. For example, the quantum dot powder of FIG. 2B has a structure in which quantum dots and a binder are mixed.

The size of the quantum dot powder of FIG. 2B may be from about 1 μm to about 500 μm and may typically be from about 1 μm to about 40 μm. In addition, although not shown in drawings, a quantum dot powder having a size that may be visually recognized may also be present.

In comparison with the quantum dot powder according to an embodiment, the quantum dot powder that does not contain inorganic homogenizing particles may be larger and non-uniform in size. Thus, it may be understood that a quantum dot having a fine and uniform size may be formed by containing the inorganic homogenizing particles.

Since the quantum dot powder according to an example embodiment includes quantum dots dispersed in the quantum dot powder and may have a fine and uniform-sized shape, the quantum dot glass cell according to an example embodiment may have a uniform and high luminous efficiency.

FIGS. 3A and 3B and FIGS. 4A and 4B are conceptual views of a glass sealing structure 130 of a quantum dot glass cell 100 according to an embodiment.

Referring to FIGS. 3A and 3B and FIGS. 4A and 4B, the glass sealing structure 130 may function to improve light emission characteristics and reliability of the quantum dot glass cell 100 by blocking moisture and oxygen.

According to an embodiment, the glass sealing structure 130 may have a structure in which glass containers 140, 140a, and 140b and a glass cover 150 are welded by laser heating. Since the glass sealing structure 130 uses only glass without using a separate bonding material, the glass sealing structure 130 may effectively block moisture and oxygen and thus the reliability of the quantum dot glass cell 100 may be improved.

Referring to FIGS. 3A and 3B and FIGS. 4A and 4B, the glass cover 150 may have a flat plate shape. A thickness t3 of the glass cover 150 may be about 0.1 mm or more, for example, about 0.3 mm to about 1.0 mm, to secure the durability of the glass sealing structure 130. A width W of the glass cover 150 may be about 1.0 mm to about 3.0 mm. However, the shape of the glass cover 150 is not limited thereto and may be variously modified.

The glass containers 140, 140a, and 140b may respectively have openings 141, 141a, and 141b, in which a dispersion matrix 120 in which quantum dot powders 110 are mixed is formed, and bonding portions 143, 143a, and 143b which are in close contact with the glass cover 150. A thickness t1 of the bottom of each of the glass containers 140, 140a, and 140b may be about 0.1 mm or more, for example, about 0.15 mm to about 1.0 mm, to secure the durability of the glass sealing structure 130. A width t2 of each of the bonding portions 143, 143a, and 143b may be about 0.1 mm to about 1 mm, for example, about 0.15 mm to about 0.4 mm, to secure a sufficient bonding area. A height h of each of the glass containers 140, 140a, and 140b may be about 0.3 mm to about 1 mm.

Figure 3A:
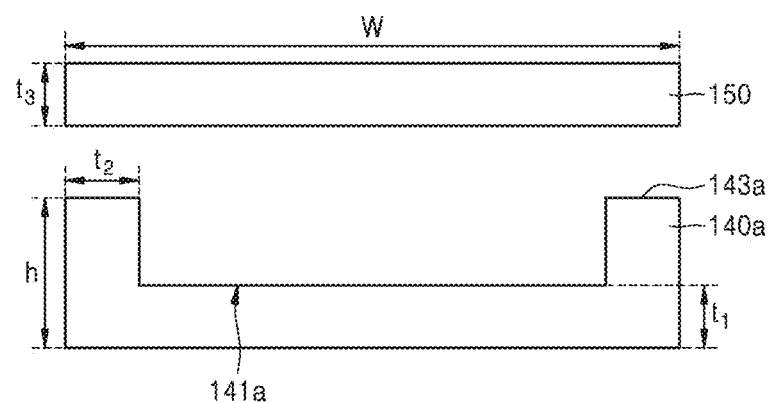
FIGS. 3A and 3B and FIGS. 4A and 4B are conceptual views of a glass sealing structure of a quantum dot glass cell according to an embodiment.
Figure 3B:
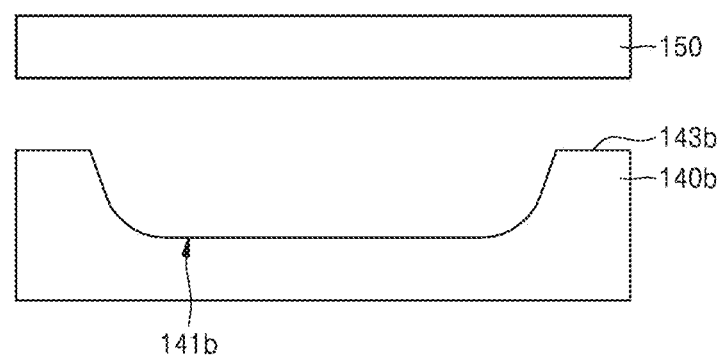

However, the shape of the glass container 140 is not limited thereto, and may be variously modified. For example, the openings 141, 141a, and 141b may have an angular shape as shown in FIG. 3A or a rounded shape as shown in FIG. 3B. For example, outer sidewalls of the glass containers 140, 140a, and 140b may not be perpendicular to bottom surfaces thereof. That is, cross sections of the glass containers 140, 140a, and 140b may have trapezoidal shapes rather than rectangular shapes.

Figure 4A:
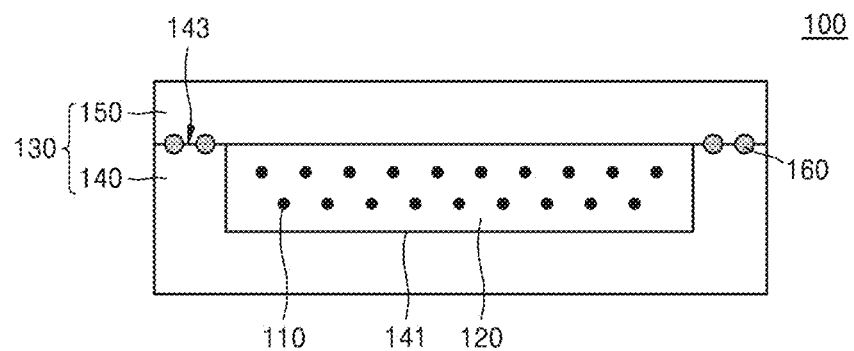
Figure 4B:
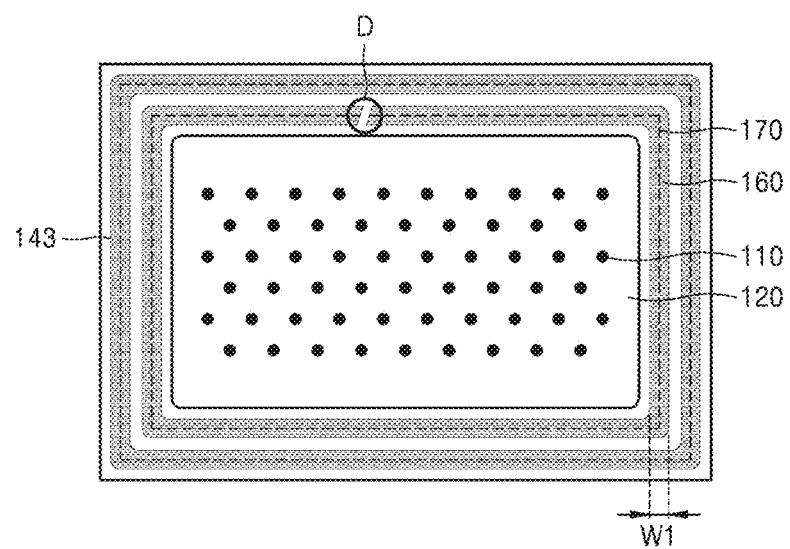

Referring to FIGS. 4A and 4B, the glass sealing structure 130 may have a structure in which the glass container 140 and the glass cover 150 are welded by laser heating. FIG. 4A is a cross-sectional view of a quantum dot glass cell viewed from the side thereof, and FIG. 4B is a cross-sectional view of the quantum dot glass cell viewed from the upper side thereof.

According to an example embodiment, a glass welding area 160 may be included in the bonding portion 143 where the glass container 140 and the glass cover 150 are in close contact with each other. The glass welding area 160 may be a glass structure formed by melting portions of the glass container 140 and the glass cover 150.

The glass welding area 160 may be formed around a weld line 170 through which the focus of laser passes. A spot size of the laser may be about 0.5 μm to about 5 μm, and a width W1 of the glass welding area 160 formed by the heating of the laser may be about 20 μm to about 200 μm.

According to an example embodiment, the weld line 170 may have a close loop shape. Although the weld line 170 has a closed loop shape, the glass welding area 160 formed around the weld line 170 may be partly disconnected. The reason is because the heating may be insufficient in some areas and thus the melting of the glass cover 150 or the glass container 140 may occur insufficiently. For example, the glass welding area 160 may include a disconnection area D.

According to an embodiment, the weld line 170 may be in the form of a plurality of closed loops, as shown in FIGS. 4A and 4B. The plurality of closed loops may be substantially parallel to each other. Since the glass welding area 160 is formed along the plurality of closed loops, the oxygen and moisture blocking performance of the glass sealing structure 130 may be improved.

To prevent, or reduce the likelihood of quantum dots contained in the quantum dot powder 110 dispersed in the dispersion matrix 120 from being heated by a laser and deteriorated, the weld line 170 may be spaced apart from the dispersion matrix 120 by about 20 μm or more. For example, the weld line 170 may be spaced apart from an upper end of the inner wall of the glass container 140 by about 20 μm or more.

Figure 5:
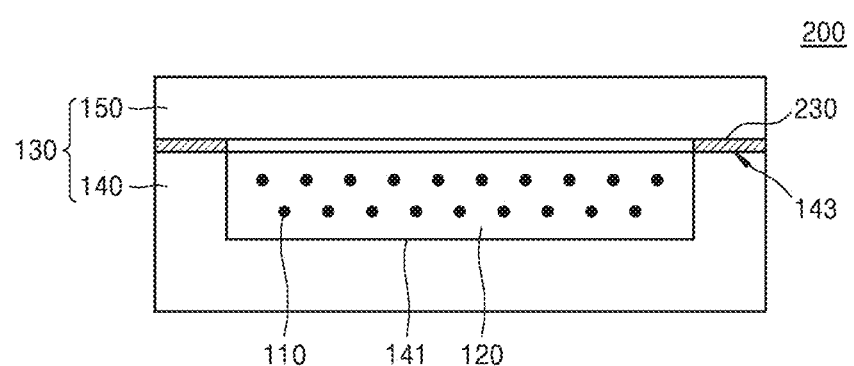
FIG. 5 is a cross-sectional view of a quantum dot glass cell according to an embodiment.

FIG. 5 is a cross-sectional view of a quantum dot glass cell 200 according to an embodiment. Hereinafter, differences from the embodiment described with reference to FIG. 3 will be mainly described.

Referring to FIG. 5, the quantum dot glass cell 200 includes a glass layer 230 between a bonding portion 143 of a glass container 140 and a glass cover 150. The glass layer 230 may be formed by heating, with a laser, a glass frit 210 (see FIG. 8) placed between the bonding portion 143 of the glass container 140 and the glass cover 150.

The glass frit 210 (see FIG. 8) may include a glass powder, an organic solvent, and a binder. In addition, the glass frit 210 (see FIG. 8) may include a light absorbing material that absorbs light having a wavelength of laser light.

The material of the glass powder may include one or more compounds selected from the group consisting of magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, and borosilicate glass By radiating laser light to the glass frit 210, a glass layer 230 from which an organic solvent or a binder is removed is formed. By the radiation of the laser light, the glass powder material contained in the glass frit 210 may be completely melted, fixed, and integrated, or partially melted and fixed.

Although the glass layer 230 is illustrated as being formed on the entire surface of the bonding portion 143, the glass layer 230 may be formed only on a part of the surface of the bonding portion 143. In this case, the width of the glass layer 230 may be about 100 μm to about 1 mm.

Figure 6A:
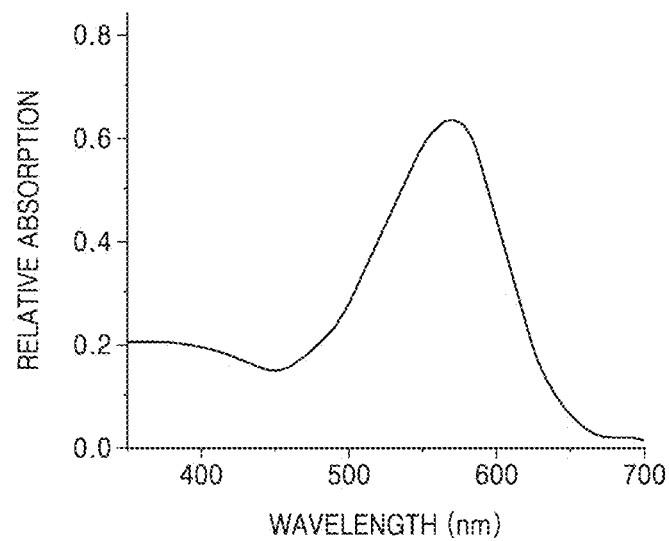
FIG. 6A is a graph showing an absorption spectrum of a glass layer of a quantum dot glass cell according to an embodiment.

FIG. 6A is a graph showing an absorption spectrum of a glass layer of a quantum dot glass cell according to an embodiment.

Referring to FIG. 6A, the horizontal axis of the graph represents the wavelength of absorbed light, and the vertical axis of the graph represents the relative absorption of the glass layer 230 (see FIG. 4). The glass layer 230 (see FIG. 5) according to an embodiment may absorb light having a wavelength in a specific region. For example, the glass layer 230 may absorb light having a wavelength of about 550 nm to about 600 nm, and may have a maximum absorption rate at a wavelength of about 570 nm to about 590 nm.

Figure 6B:
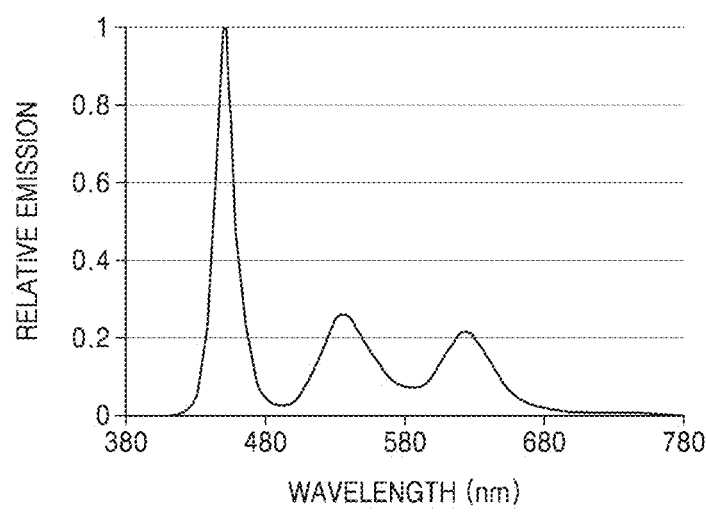
FIG. 6B is a graph showing an emission spectrum of a light-emitting device package including a quantum dot glass cell according to an embodiment.

FIG. 6B is a graph showing an emission spectrum of a light-emitting device package including a quantum dot glass cell according to an embodiment. The quantum dot glass cell 100 (see FIG. 4) of the example embodiment does not include the glass layer 230 (see FIG. 5).

Referring to FIG. 6B, the horizontal axis of the graph represents the wavelength of emitted light, and the vertical axis of the graph represents the relative amount of emitted light of the quantum dot glass cell. The light-emitting device package of the example embodiment may emit blue light having a wavelength of about 430 nm to about 480 nm, green light having a wavelength of about 490 nm to about 570 nm, and red light having a wavelength of about 590 nm to about 650 nm.

When a glass layer 230 having an absorption spectrum as shown in FIG. 6A is added to a light-emitting device package having the emission spectrum, the emission amount of light having a wavelength of about 550 nm to about 600 nm, which is a boundary between green light and red light, may be decreased. Thus, color purity and color reproducibility may be improved.

FIGS. 7A to 7D are cross-sectional views illustrating a method of manufacturing a quantum dot glass cell, according to an embodiment.

Referring to FIGS. 7A to 7D, the method of manufacturing a quantum dot glass cell may include preparing a glass container 140, forming a dispersion matrix 120, in which a quantum dot powder 110 is dispersed, in an opening 141 of the glass container 140, and welding a bonding portion 143 of the glass container 140 and a glass cover 150 by using a laser. Prior to descriptions of operations of the method, manufacturing the quantum dot powder 110 will be first described.

As a first operation, quantum dots may be prepared. According to an embodiment, the quantum dots may be synthesized by a chemical wet process. In the chemical wet process, the quantum dots may be formed by incorporating a precursor material into an organic solvent. Thus, the synthesized quantum dots may be dispersed in the organic solvent.

When the quantum dots are dispersed in the organic solvent, separating the quantum dots from the organic solvent may be performed. The separating of the quantum dots from the organic solvent may use a centrifugal separation method. Centrifugation by the centrifugal separation method may be repeated a plurality of times. In addition, the method may further include cleaning the quantum dots, separated from the organic solvent, by using isopropyl alcohol (IPA) and/or hexane.

The organic solvent tends to hinder the curing of encapsulant such as epoxy, polymethyl methacrylate (PMMA), polyethylene, polystyrene, polyurethane, or silicone resin. Thus, by performing separating the organic solvent from the quantum dots and removing the organic solvent, the encapsulant may be prevented, or reduced in likelihood, from being uncured to thereby improve the reliability of the quantum dot glass cell. In particular, a silicone resin having high heat, moisture and light durability may be used as the encapsulant. Since the silicone resin has a relatively low curing rate, carrying out a process of removing the organic solvent contained in the quantum dots may be desirable or necessary.

Next, the separated quantum dots may be mixed with inorganic homogenizing particles and a binder to form the quantum dot powder 110. By adding the inorganic homogenizing particles to the quantum dot powder 110, the size of the quantum dot powder 110 may be uniform or more uniform and the dispersibility of the quantum dot powder 110 may be improved.

Figure 7A:
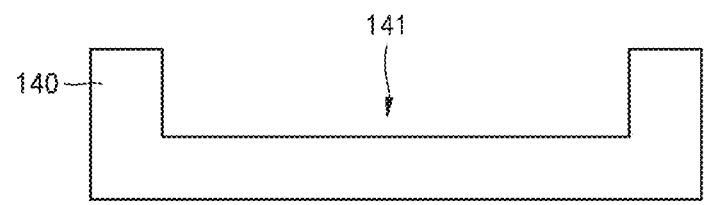
FIGS. 7A to 7D are cross-sectional views illustrating a method of manufacturing a quantum dot glass cell, according to an embodiment.

In addition, the glass container 140 may be prepared as shown in FIG. 7A. The glass container 140 may be manufactured in various ways. The glass container 140 may be manufactured by a method of sandblasting or wet etching a glass plate to form the opening 141. In another embodiment, the glass container 140 may be manufactured by use of a mold or a method of bonding a glass structure constituting the bonding portion 143 to a glass plate.

Figure 7B:
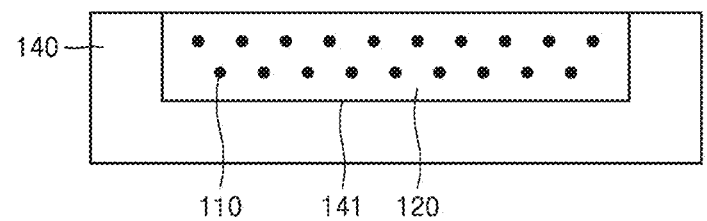

Next, the dispersion matrix 120 in which the quantum dot powder 110 is dispersed may be formed in the opening 141 of the glass container 140, as shown in FIG. 7B.

After the quantum dot powder 110 is formed, a mixture is formed by mixing the quantum dot powder 110 and the encapsulant. According to an embodiment, a light-diffusing agent may be further added to form the mixture. For example, the mixture may be formed by mixing the quantum dot powder 110, an encapsulant, and an alumina (Al2O3) powder.

In a next operation, the mixture is filled in the opening 141 of the glass container 140, and then the mixture is cured to form the dispersion matrix 120. The curing may be a process of heating the mixture, and for example, the curing may be performed at about 50° C. to about 150° C. for about 20 minutes to about 2 hours. In some example embodiments, the curing may be performed at about 50° C. to about 120° C. for about 20 minutes to about 1 hour. In order to prevent or reduce the likelihood of the quantum dots from being deteriorated due to oxygen, the curing may be performed in a non-oxidizing atmosphere, for example, an inert atmosphere such as a nitrogen atmosphere.

Figure 7C:
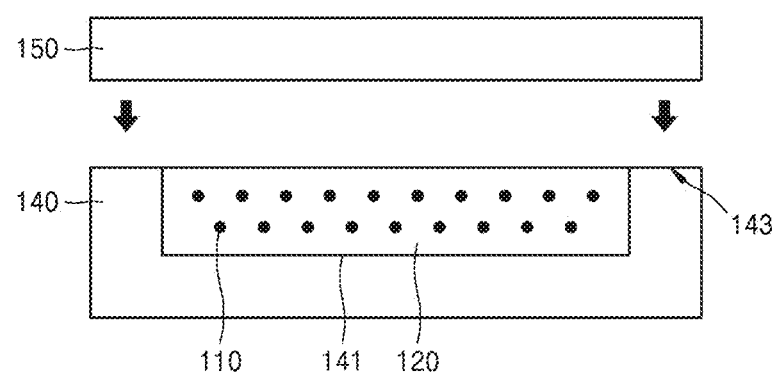
Figure 7D:
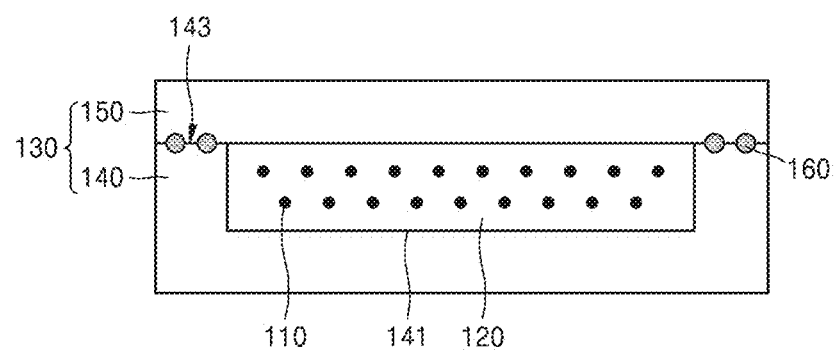

After the dispersion matrix 120 is formed, the bonding portion 143 of the glass container 140 and the glass cover 150 may be welded by using laser light, as shown in FIGS. 7C and 7D. As the laser light, for example, laser light having a wavelength in a visible light region, an infrared region, or an ultraviolet region may be used. Examples of a laser for emitting laser light having a wavelength in the visible light region or the infrared region may include a gas laser such as an Ar laser, a Kr laser, or a CO2 laser, a solid laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser, and/or a semiconductor laser such as GaN, GaAs, GaAlAs, or InGaAsP. Examples of a laser for emitting laser light having a wavelength in the ultraviolet region may include an excimer laser such as an XeCl laser or a KrF laser, and a solid laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser.

According to an example embodiment, the welding using a laser may include bringing the glass cover 150 into close contact with the bonding portion 143 and heating a contact portion between the glass container 140 and the glass cover 150 with a laser to form a glass welding area 160. Since such a bonding method does not use a separate bonding material and the quantum dot glass cell is sealed with only glass, moisture and oxygen may be effectively blocked and the reliability of the quantum dot glass cell may be improved.

Referring back to FIG. 4B, heating the contact portion with a laser may be heating the contact portion with a laser along one or more weld lines 170. The weld line 170 may be in the form of a closed loop. In another example, the weld line 170 may be in the form of a plurality of closed loops. The plurality of closed loops may be parallel, or substantially parallel to each other.

A method by which a laser beam is radiated may vary. For example, a method by which a laser beam is continuously radiated while moving along the weld line 170 may be used. In another embodiment, a method by which a laser beam is continuously radiated along one weld line 170 and then is radiated along the same weld line 170 again may be used. In another embodiment, a method by which a laser beam is intermittently radiated along one weld line 170 to obtain a discrete partial bond and then is continuously radiated along the same weld line 170 may be used.

Figure 8A:
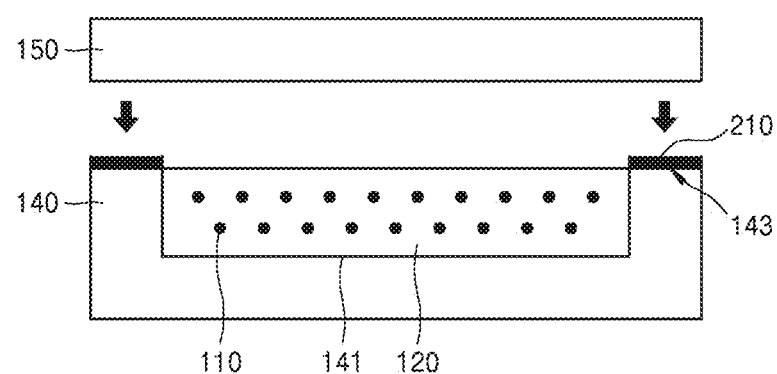
FIGS. 8A and 8B are cross-sectional views illustrating a method of manufacturing a quantum dot glass cell, according to an embodiment.
Figure 8B:
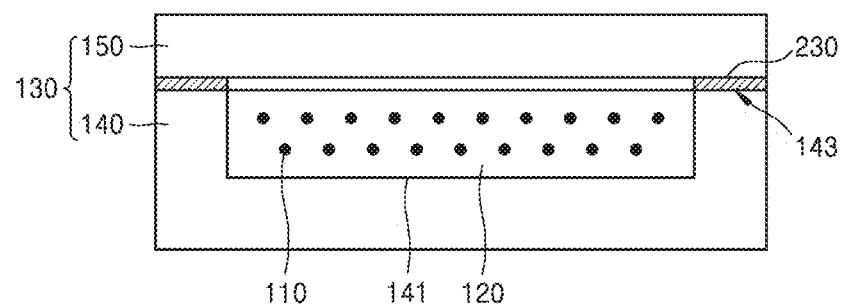

FIGS. 8A and 8B are cross-sectional views illustrating a method of manufacturing a quantum dot glass cell, according to an embodiment. Hereinafter, differences from the embodiment described with reference to FIGS. 7A to 7D will be mainly described.

Referring to FIGS. 8A and 8B, in the embodiment, bonding using a laser may be performed by using a glass frit 210. Specifically, the bonding using the laser may include forming a layer of the glass frit 210 on a bonding portion 143 of a glass container 140, bringing a glass cover 150 into close contact with the glass frit 210, and forming a glass layer 230 by radiating laser light to the glass frit 210.

By radiating the laser light to the glass frit 210, the glass layer 230 from which an organic solvent or a binder has been removed may be formed. By the radiation of the laser light, a glass powder material in the glass frit 210 may be completely melted, fixed, and integrated, or partially melted and fixed.

In this bonding method, since a dispersion matrix is sealed by glass, moisture and oxygen may be effectively blocked and thus the reliability of the quantum dot glass cell may be improved. In addition, when a glass layer that absorbs light having a specific wavelength, for example, about 550 nm to about 600 nm is formed, color purity and color reproducibility may be improved.

Figure 9A:
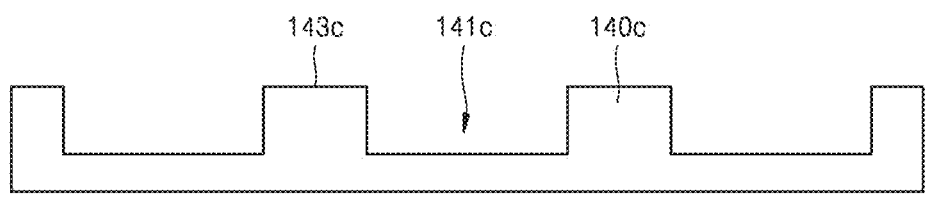
FIGS. 9A to 9C are cross-sectional views illustrating a method of manufacturing a quantum dot glass cell, according to an embodiment.
Figure 9B:
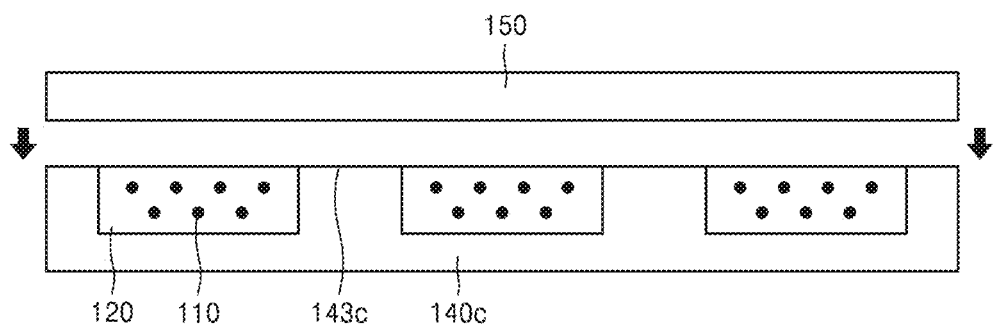
Figure 9C:
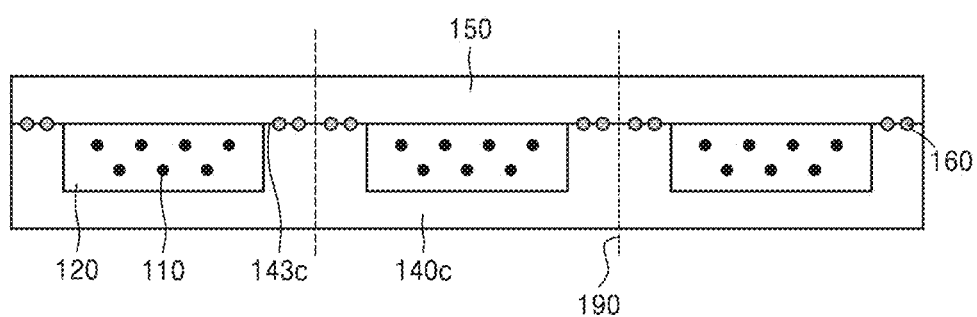

FIGS. 9A to 9C are cross-sectional views illustrating a method of manufacturing a quantum dot glass cell, according to an embodiment. Hereinafter, differences from the embodiment described with reference to FIGS. 7A to 7D or FIGS. 8A and 8B will be mainly described.

Referring to FIGS. 9A to 9C, a plurality of quantum dot glass cells may be produced at the same time. In this case, a glass container 140c may have a plurality of openings 141c. The plurality of openings 141c may be two-dimensionally arranged on the plane of the glass container 140c. The width of a bonding portion 143c between the plurality of openings 141c may be about 0.6 mm or more to about 2 mm or less. The plurality of openings 141c may be sealed by a single glass cover 150.

A quantum dot powder 110 is manufactured in the same manner as described with reference to FIGS. 7A to 7D or FIGS. 8A and 8B, and the quantum dot powder 110 is mixed with an encapsulant to form a mixture. The mixture is coated on the plurality of openings 141c, and then the mixture is cured to form a dispersion matrix 120.

Next, the glass cover 150 and the glass container 140c may be welded by using a laser. The welding using the laser is the same as that described with reference to FIGS. 7A to 7D or FIGS. 8A and 8B. However, when the bonding portion 143c is welded, a weld line 170 (see FIG. 4B) through which the focus of the laser passes may be spaced apart from a cutting line 190 so that a glass welding area 160 is not formed in an area through which the cutting line 190 passes.

Next, the glass cover 150 and the glass container 140c may be cut along the cutting line 190, which passes through the bonding portion 143c between one opening 141c and another opening 141c, to manufacture a plurality of quantum dot glass cells. A mechanical process or a laser cutting method may be used for the cutting.

Figure 10:
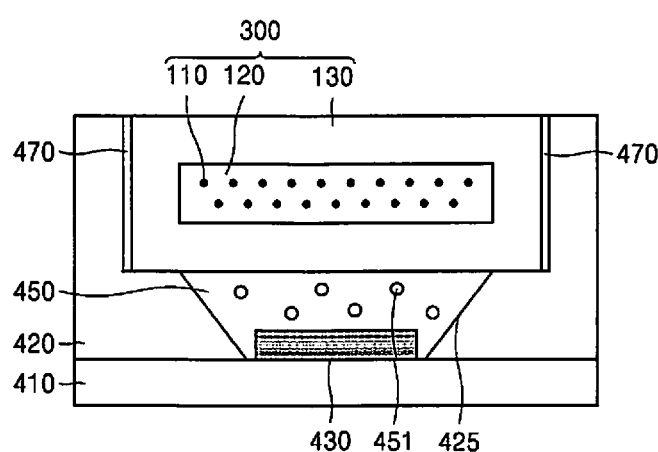
FIG. 10 is a cross-sectional view illustrating the structure of a light-emitting device package including a quantum dot glass cell according to an embodiment.

FIG. 10 is a cross-sectional view illustrating the structure of a light-emitting device package 400 including a quantum dot glass cell according to an embodiment.

Referring to FIG. 10, the light-emitting device package 400 according to the present embodiment may include a substrate 410, a housing 420 including a cavity 425, a light-emitting device 430, a light-emitting device encapsulation portion 450, and a quantum dot glass cell 300.

The substrate 410 may include a resin, a ceramic, or a metal. For example, the substrate 410 may be or include a printed circuit board (PCB), a metal printed circuit board (MCPCB), or a flexible printed circuit board (FPCB). In an embodiment, the substrate 410 may be a substrate capable of high heat dissipation such that protecting a quantum dot powder and the light-emitting device 430 from heat and improving the reliability of the light-emitting device package 400 may be possible. For example, the substrate 410 may be or include a ceramic heat-dissipating plate or a metal printed circuit board.

The housing 420 including the cavity 425 may be on the substrate 410. The light-emitting device 430, the light-emitting device encapsulation portion 450, the quantum dot glass cell 300, and the like may be in the cavity 425 of the housing 420. In another embodiment, the quantum dot glass cell 300 may be on the housing 420.

The housing 420 may include a plastic material, such as acrylonitrile butadiene styrene (ABS), a liquid crystalline polymer (LCP), a polyamide (PA), a polyphenylene sulfide (PPS), or a thermoplastic elastomer (TPE), a ceramic material, or a metal material.

According to an example embodiment, the material of the housing 420 may be or include a highly heat-dissipating and highly reflective material that may effectively dissipate heat to the outside of the light-emitting device package 400 to thereby improve the reliability of the light-emitting device package 400 and may effectively reflect light emitted from the light-emitting device 430 and the quantum dot glass cell 300 to thereby improve the light efficiency of the light-emitting device package 400. For example, the housing 420 may include a metal such as aluminum (Al) or copper (Cu). To increase the reflectance of the housing 420, the cavity 425 of the housing 420 may include an inclined inner wall.

According to an embodiment, a cavity wall of the housing 420 may include a reflective portion 470. The reflective portion 470 may reflect light emitted from the light-emitting device 430 and/or the quantum dot glass cell 300 to thereby improve the brightness of the light-emitting device package 400.

The reflective portion 470 may include a polymer material containing a material having a high light reflectance. For example, the polymer material may be or include a material having excellent thermal stability and light stability, for example, polyphthalamide (PPA). The material having a high light reflectance may be or include a metal such as aluminum (Al), silver (Ag), or gold (Au), or a metal oxide such as titanium dioxide ($TiO_2$).

The reflective portion 470 may be formed by coating a metal or a metal oxide on the housing 420 or by printing metallic ink. Also, the reflective portion 470 may be formed by attaching a reflective film on the housing 420.

According to an example embodiment, the reflective portion 470 may surround a side wall of the quantum dot glass cell 300. The reflective portion 470 may allow light emitted from the light-emitting device 430 to be effectively incident on the quantum dot powder 110, to thereby increase a wavelength conversion efficiency, and may allow light wavelength-converted by the quantum dot glass cell 300 to be effectively emitted to the outside of the light-emitting device package 400, to thereby improve the brightness.

The light-emitting device 430 may be on the substrate 410. The light-emitting device 430 may be in the cavity 425 of the housing 420. The light-emitting device 430 may be a photoelectric device, such as an LED, that receives an electrical signal and emits light. For example, the light-emitting device 430 may be or include a GaN-based LED emitting blue light. In another example, the light-emitting device 430 may be an AlGaN or AlGaInN-based LED emitting ultraviolet light.

The light-emitting device 430 may be electrically connected to the substrate 410. The light-emitting device 430 may be electrically connected to the substrate 410 through a conductive wire. Alternatively, the light-emitting device 430 may be electrically connected directly to the substrate 410 in a flip chip bonding manner without a conductive wire.

The light-emitting device encapsulation portion 450 may wrap around the light-emitting device 430. The light-emitting device encapsulation portion 450 may function to physically and chemically protect the light-emitting device 430. The light-emitting device encapsulation portion 450 may include an epoxy, polymethyl methacrylate (PMMA), polyethylene, polystyrene, or polyurethane resin. In some embodiments, the light-emitting device encapsulation portion 450 may include a silicone resin that is highly resistant to heat, moisture, and light.

According to an example embodiment, the light-emitting device encapsulation portion 450 may further include a phosphor. The phosphor may absorb light emitted from the light-emitting device 430 and emit light having a different wavelength. As the light-emitting device encapsulation portion 450 further includes a phosphor having a wavelength conversion function independently of the quantum dot glass cell 300, the brightness and color coordinates of the light-emitting device package 400 may be additionally controlled.

The phosphor may emit green light. In this case, the phosphor may include at least one of a silicate-based phosphor such as $(Ba,Sr)_2SiO_4$:Eu, an oxide-based phosphor such as $Y_3Al_5O_{12}$:Ce, $Tb_3Al_5O_{12}$:Ce, or $Lu_3Al_5O_{12}$:Ce, and a nitride-based phosphor such as $\beta$-SiAlON:Eu.

The phosphor may emit red light. In this case, the phosphor may include at least one of a nitride-based phosphor such as $CaAlSiN_3$:Eu, $Sr_2Si_5N_8$:Eu, $SrSiAl_4N_7$:Eu, or $SrLiAl_3N_4$:Eu, or a fluoride-based phosphor. The fluoride-based phosphor may be a phosphor having a formula $A_2MF_6$:$Mn^{4+}$. In the formula, A may be one selected from Li, Na, K, Rb, Ce, and $NH_4$, and M may be one selected from Si, Nb, Ti, Y, Gd, and Ta.

A phosphor composition corresponds with stoichiometry, and each element may be replaced with another element in each group on the periodic table. For example, Sr may be replaced with Ba, Ca, or Mg of the alkaline earth metal (II) group, and Y may be replaced with a lanthanide-based element, such as Tb, Lu, Sc, or Gd. In addition, Eu, which is an active agent, may be replaced with Ce, Tb, Pr, Er, or Yb according to a desired energy level. An active agent may be used alone, or a negative active agent or the like may be additionally used for characteristics modification. In particular, in order to improve reliability at high temperature and high humidity, a fluoride-based red phosphor may be coated with a fluoride that does not contain Mn or may further include an organic coating on the surface of the phosphor or the surface of the fluoride coating that does not contain Mn.

According to an embodiment, the light-emitting device encapsulation portion 450 may further include a light-diffusing agent 451. The light-diffusing agent 451 may be dispersed in the light-emitting device encapsulation portion 450 in the form of particles to disperse and scatter light in various directions. The light-diffusing agent 451 may relatively reduce the amount of light directly reaching quantum dots directly above the light-emitting device 430, to thereby reduce the deterioration of the quantum dots, and may increase the total amount of light, which is incident on the quantum dots, to thereby increase light conversion efficiency. In addition, the light-diffusing agent 451 may improve the brightness of the light-emitting device package. The light-diffusing agent 451 may include at least one of silica, titania, and alumina. The size of particles in the light-diffusing agent 451 may be from about 50 nm to about 10 μm.

The quantum dot glass cell 300 may be on the light-emitting device encapsulation portion 450. The quantum dot glass cell 300 may be the quantum dot glass cell 100 or 200 described with reference to FIGS. 4A and 4B or FIG. 5. For example, the quantum dot glass cell 300 may include a quantum dot powder 110 in which quantum dots, inorganic homogenizing particles and a binder are mixed, a dispersion matrix 120 in which the quantum dot powder 110 is dispersed, and a glass sealing structure 130 surrounding the dispersion matrix 120.

The quantum dot glass cell 300 may perform a wavelength conversion function of absorbing light emitted from the light-emitting device 430 and emitting light having a wavelength different from that of the absorbed light. For example, the quantum dot glass cell 300 may convert blue light emitted from the light-emitting device 430 into green light or red light. Alternatively, the quantum dot glass cell 300 may convert ultraviolet light emitted from the light-emitting device 430 into blue light, green light or red light.

The light-emitting device package 400 may uniformly disperse quantum dots and protect or improve the protection of the quantum dots from heat, moisture, and oxygen, and thus, reliability and light emission characteristics may be improved. In addition, since the light-emitting device package 400 includes the quantum dot glass cell 300 including a quantum dot powder, there is no need for an additional structure to include quantum dots outside the light-emitting device package 400. Thus, there is an economical advantage since a separate structure is not required for each application system.

Figure 11A:
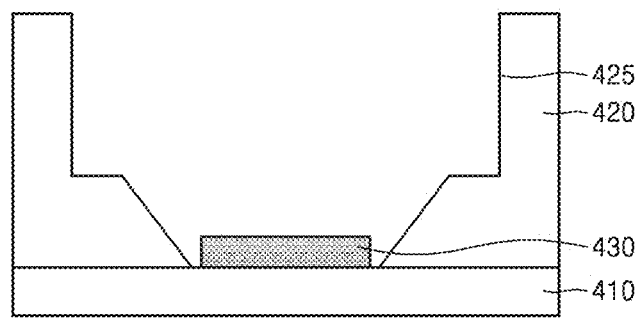
FIGS. 11A to 11C are cross-sectional views illustrating a method of manufacturing a light-emitting device package including a quantum dot glass cell, according to an embodiment.
Figure 11B:
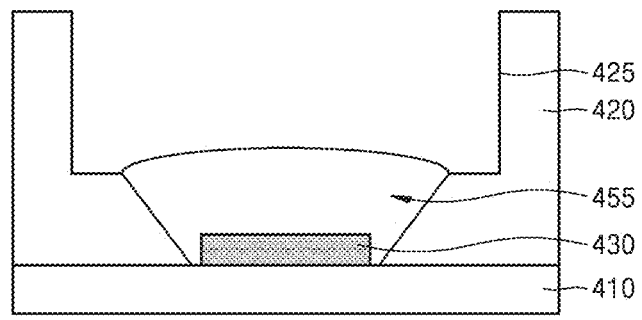
Figure 11C:
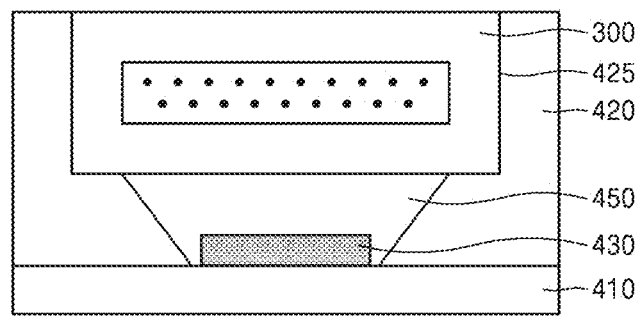

FIGS. 11A to 11C are cross-sectional views illustrating a method of manufacturing a light-emitting device package including a quantum dot glass cell, according to an embodiment.

Referring to FIGS. 11A to 11C, a housing 420 and a light-emitting device 430 are assembled on a substrate 410. The light-emitting device 430 may be electrically connected to the substrate 410 through a wire bonding process or a flip chip bonding process.

Next, an encapsulant 455 is injected into a cavity 425 of the housing 420 to cover the light-emitting device 430. The encapsulant 455 may include a light-diffusing agent or a phosphor. The brightness and color coordinates of the light-emitting device package may be adjusted by measuring light emission characteristics of a manufactured quantum dot glass cell 300 and determining the amount of the phosphor of the encapsulant 455 or the like.

The light-diffusing agent may be injected into the cavity 425 of the housing 420 in various ways. For example, dispensing, spray coating, a method by which a phosphor is mixed with an encapsulant and a mixture is coated in a cavity 425 of the housing 420, and a method by which a phosphor film is attached on the encapsulant 455 or the light-emitting device 430 may be used.

Next, the quantum dot glass cell is positioned on the encapsulant 455, and then the encapsulant 455 is cured to form a light-emitting device encapsulation portion 450 to thereby complete the light-emitting device package.

Figure 12:
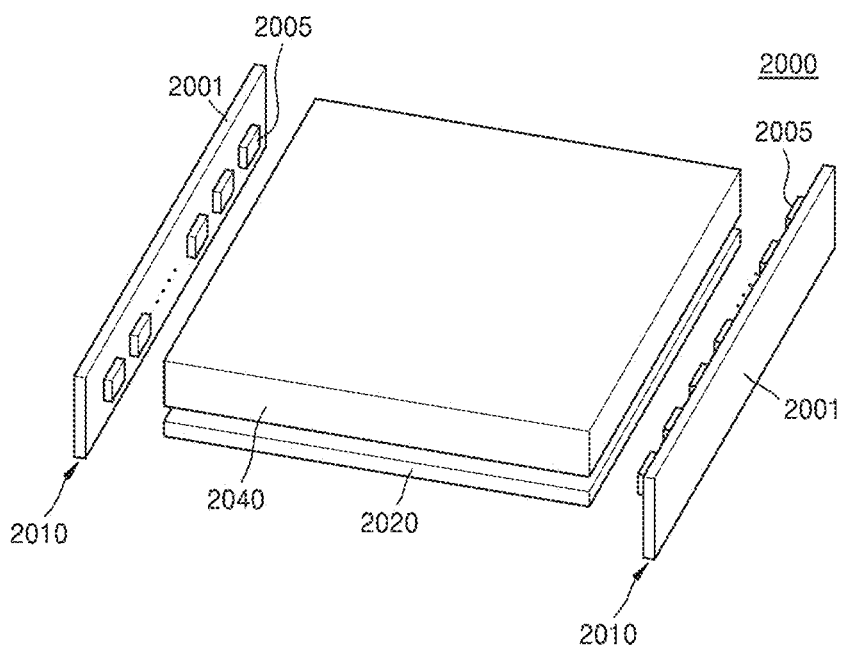
FIG. 12 is a perspective view of a backlight unit including a light-emitting device package according to an embodiment.

FIG. 12 is a perspective view of a backlight unit 2000 including a light-emitting device package according to an embodiment.

Referring to FIG. 12, the backlight unit 2000 may include a light guide plate 2040 and light source modules 2010 on both sides of the light guide plate 2040. In addition, the backlight unit 2000 may further include a reflective plate 2020 under the light guide plate 2040. The backlight unit 2000 according to the embodiment may be an edge-type backlight unit.

According to an embodiment, the light source module 2010 may be provided only one side surface of the light guide plate 2040 or may be additionally provided on the other side. The light source module 2010 may include a printed circuit board (PCB) 2001 and a plurality of light sources 2005 mounted on the PCB 2001. The light source 2005 may be the light-emitting device package 400 (see FIG. 10) according to the above-described embodiment.

Figure 13:
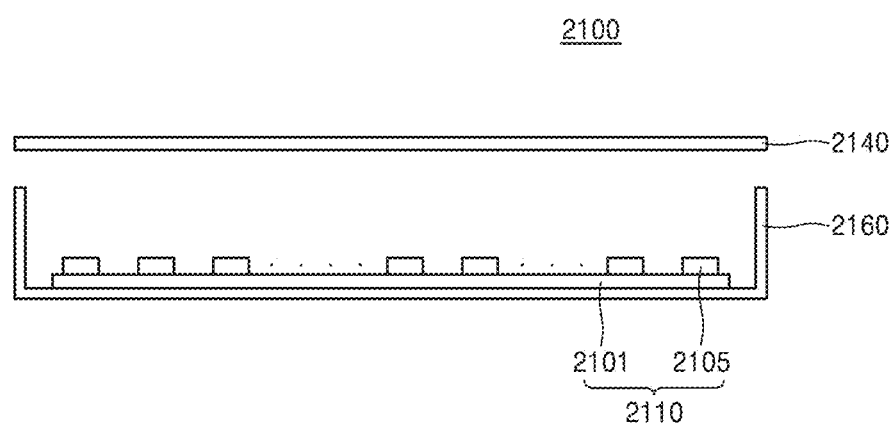
FIG. 13 is a cross-sectional view of a direct-type backlight unit including a light-emitting device package according to an embodiment.

FIG. 13 is a cross-sectional view of a direct-type backlight unit 2100 including a light-emitting device package according to an embodiment.

Referring to FIG. 13, the backlight unit 2100 may include a light diffusion plate 2140 and a light source module 2110 under the light diffusion plate 2140. In addition, the backlight unit 2100 may further include a bottom case 2160 under the light diffusion plate 2140 to accommodate the light source module 2110. The backlight unit 2100 according to the present example embodiment may be a direct-type backlight unit.

The light source module 2110 may include a PCB 2101 and a plurality of light sources 2105 mounted on the PCB 2101. Each of the plurality of light sources 2105 may be the light-emitting device package 400 (see FIG. 10) according to the above-described embodiment.

Figure 14:
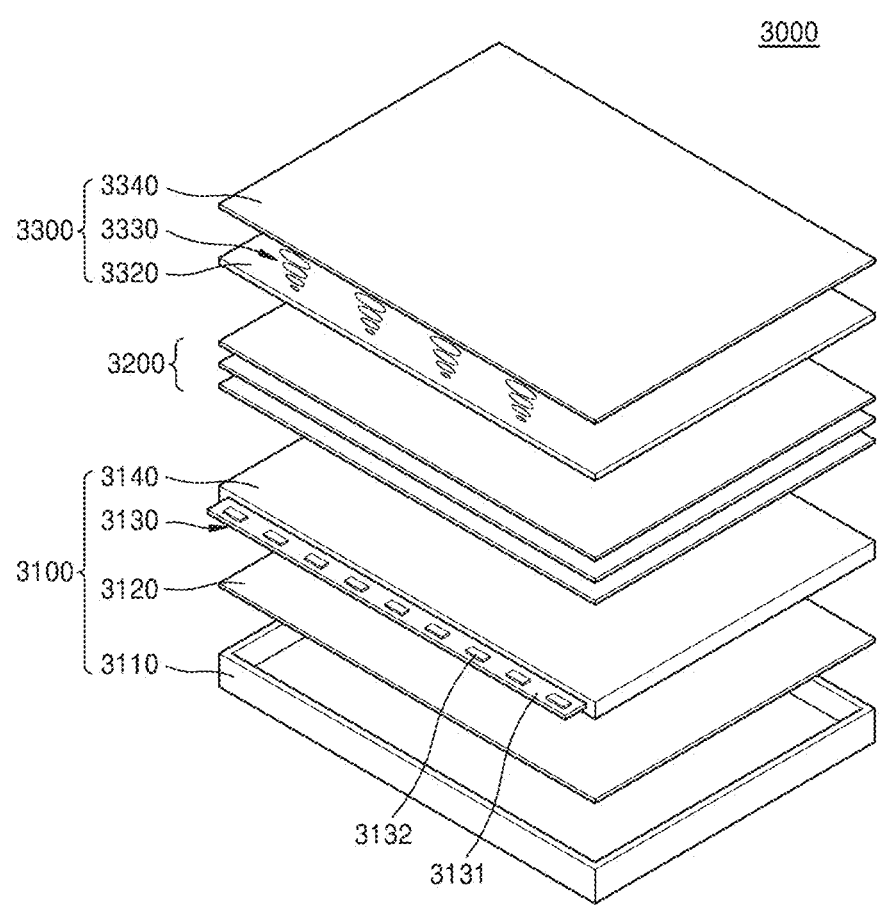
FIG. 14 is a perspective view of a display device including a light-emitting device package according to an embodiment.

FIG. 14 is a perspective view of a display device 3000 including a light-emitting device package according to an embodiment.

Referring to FIG. 14, the display device 3000 may include a backlight unit 3100, an optical sheet 3200, and a display panel 3300 such as a liquid crystal panel.

The backlight unit 3100 may include a bottom case 3110, a reflection plate 3120, a light guide plate 3140, and a light source module 3130 on at least one side of the light guide plate 3140. The light source module 3130 may include a PCB 3131 and a light source 3132. In particular, the light source 3132 may be a side view-type light-emitting device mounted on a side adjacent to a light emission surface.

The optical sheet 3200 may be arranged between the light guide plate 3140 and the display panel 330 and may include various types of sheets, such as a diffusion sheet, a prism sheet, or a protection sheet.

The display panel 3300 may display an image by using light emitted from the optical sheet 3200. The display panel 3300 may include an array substrate 3320, a liquid crystal layer 3330, and a color filter substrate 3340. The array substrate 3320 may include pixel electrodes arranged in a matrix form, thin film transistors configured to apply a driving voltage to the pixel electrodes, and signal lines configured to operate the thin film transistors.

The color filter substrate 3340 may include a transparent substrate, a color filter, and a common electrode. The color filter may include filters configured to selectively transmit light having a specific wavelength in white light emitted by the backlight unit 3100. The liquid crystal layer 3330 may be rearranged by an electric field formed between the pixel electrode and the common electrode and adjust an optical transmittance. The light, of which the optical transmittance is adjusted, may display an image while passing through the color filter of the color filter substrate 3340. The display panel 3300 may further include a driving circuit configured to process an image signal.

The light source 3132 may be or include the light-emitting device package 400 (see FIG. 10) according to the above-described embodiment. Since the light source 3132 emits blue light, green light, and red light which have a relatively small half-width, the emitted light may implement blue, green, and red colors having high color purity after passing through the color filter substrate 3340.

Figure 15:
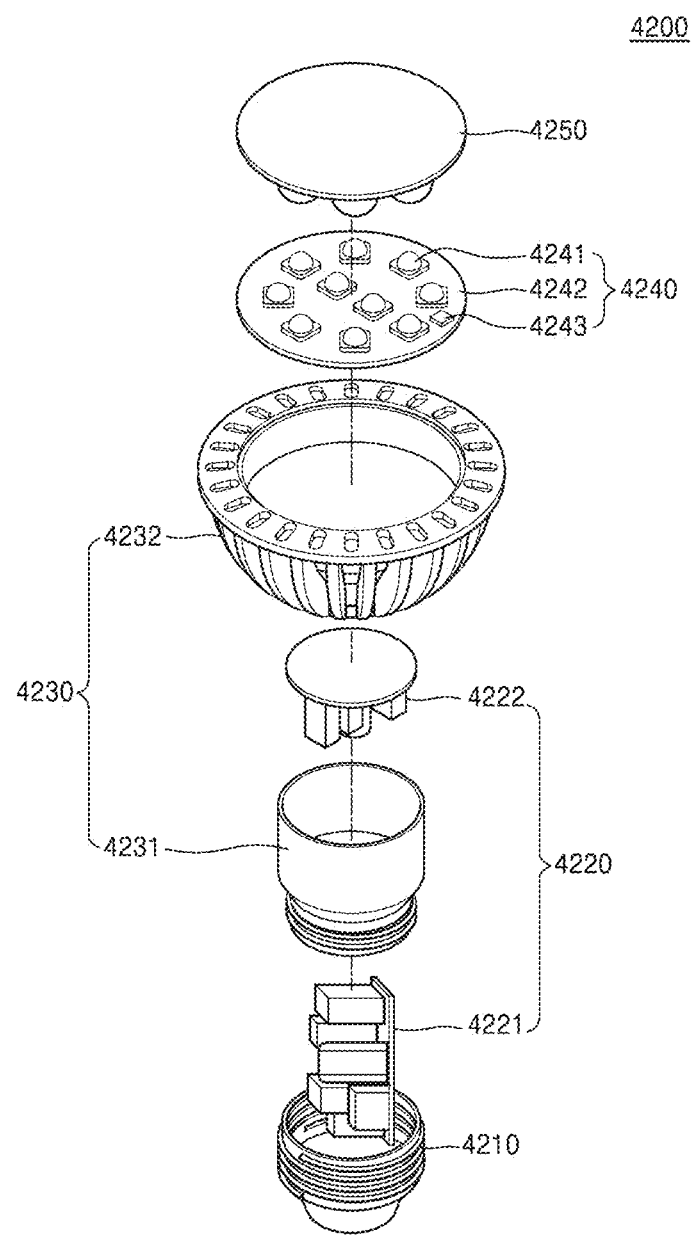
FIG. 15 is a perspective view of a lighting apparatus including a light-emitting device package according to an embodiment.

FIG. 15 is a perspective view of a lighting apparatus 4200 including a light-emitting device package according to an embodiment. The lighting apparatus 4200 may be a bulb-type lamp.

Referring to FIG. 18, the lighting apparatus 4200 may include a socket 4210, a power supply 4220, a heat sink 4230, a light source module 4240, and an optical unit 4250.

According to an embodiment, the light source module 4240 may include a light-emitting device array, and the power supply 4220 may include a light-emitting device driver.

The socket 4210 may be configured to be replaceable with an existing lighting apparatus. Power may be supplied to the lighting apparatus 4200 through the socket 4210. The power supply 4220 may be dissembled into a first power supply 4221 and a second power supply 4222. The heat sink 4230 may include an internal heat sink 4231 and an external heat sink 4232. The internal heat sink 4231 may be directly connected to the light source module 4240 and/or the power supply 4220. The internal heat sink 4231 may transmit heat to the external heat sink 4232. The optical unit 4250 may include an internal optical unit (not illustrated) and an external optical unit (not illustrated). The optical unit 4250 may be configured to uniformly disperse light emitted by the light source module 4240.

The light source module 4240 may receive power from the power supply 4220 and emit light to the optical unit 4250. The light source module 4240 may include one or more light-emitting device packages 4241, a circuit board 4242, and controller 4243. The controller 4243 may store driving information of the light-emitting device packages 4241. The light-emitting device packages 4241 may be the light-emitting device package 400 (see FIG. 10) according to the above-described embodiment.

While inventive concepts have been particularly shown and described with reference to embodiments thereof, it will be understood that various changes in form and details may be made therein without departing from the spirit and scope of the following claims.

What is claimed is:

1. A quantum dot glass cell comprising:
   quantum dots, inorganic homogenizing particles, and a binder all mixed together to form a quantum dot powder;
   a dispersion matrix in which the quantum dot powder is dispersed; and
   a glass sealing structure surrounding the dispersion matrix.

2. The quantum dot glass cell of claim 1, wherein the inorganic homogenizing particles includes at least one of silica ($SiO_2$), titania ($TiO_2$), or alumina ($Al_2O_3$).

3. The quantum dot glass cell of claim 1, wherein the binder includes at least one of an ethylene-methacrylic acid (EMAA) copolymer resin or an ethylene-acrylic acid (EAA) copolymer resin.

4. The quantum dot glass cell of claim 1, wherein the dispersion matrix includes a silicone resin.

5. The quantum dot glass cell of claim 1, wherein the dispersion matrix further comprises a light-diffusing agent.

6. The quantum dot glass cell of claim 5, wherein the light-diffusing agent comprises alumina ($Al_2O_3$).

7. The quantum dot glass cell of claim 1, wherein a diameter of the quantum dot powder ranges from about 1 μm to about 50 μm.

8. The quantum dot glass cell of claim 1, wherein the glass sealing structure includes a glass container and a glass cover which are joined together.

9. The quantum dot glass cell of claim 8, wherein the glass container comprises an opening in which the dispersion matrix is arranged, and a bonding portion in close contact with the glass cover.

10. The quantum dot glass cell of claim 9, wherein the glass sealing structure includes a glass welding area at the bonding portion.

11. The quantum dot glass cell of claim 8, further comprising:
    a glass layer between the glass cover and the glass container.

12. The quantum dot glass cell of claim 11, wherein the glass layer absorbs light having a wavelength of 550 nm to 600 nm.

13. A quantum dot glass cell comprising:
    a glass container including an opening;
    a dispersion matrix in the opening;
    quantum dots, inorganic homogenizing particles, and a binder all mixed together to form a quantum dot powder, the quantum dot powder dispersed in the dispersion matrix; and
    a glass cover on the glass container and the dispersion matrix.

14. The quantum dot glass cell of claim 13, further comprising:
    a glass welding area connecting the glass container to the glass cover.

15. The quantum dot glass cell of claim 13, further comprising:
    a glass layer between the glass container and the glass cover.

16. A light-emitting device package comprising:
    a substrate;
    a housing on the substrate, the housing comprising a cavity;
    a light-emitting device on the substrate, the light-emitting device being in the cavity of the housing;
    a light-emitting device encapsulation portion covering the light-emitting device; and
    a quantum dot glass cell on the light-emitting device encapsulation portion,
    wherein the quantum dot glass cell includes,
    quantum dots, inorganic homogenizing particles, and a binder all mixed together to form a quantum dot powder,
    a dispersion matrix in which the quantum dot powder is dispersed, and
    a glass sealing structure surrounding the dispersion matrix.

17. The light-emitting device package of claim 16, wherein the housing comprises at least one of aluminum (Al) or copper (Cu).

18. The light-emitting device package of claim 16, further comprising:
    a reflective portion surrounding side walls of the quantum dot glass cell.

19. The light-emitting device package of claim 16, wherein the light-emitting device encapsulation portion comprises a phosphor.

20. The light-emitting device package of claim 16, wherein the light-emitting device encapsulation portion comprises a light-diffusing agent.

* * * * *